(12) United States Patent
Shamir et al.

(10) Patent No.: US 9,678,114 B2
(45) Date of Patent: Jun. 13, 2017

(54) APPARATUS AND METHODS THEREOF FOR ERROR CORRECTION IN SPLIT CORE CURRENT TRANSFORMERS

(71) Applicant: Panoramic Power Ltd., Kfar Saba (IL)

(72) Inventors: Adi Shamir, Kidron (IL); Itay Reved, Kiryat Uno (IL)

(73) Assignee: Panoramic Power Ltd., Kfar Saba (IL)

( * ) Notice: Subject to any disclaimer, the term of this patent is extended or adjusted under 35 U.S.C. 154(b) by 356 days.

(21) Appl. No.: 14/211,587

(22) Filed: Mar. 14, 2014

(65) Prior Publication Data

US 2014/0200843 A1 Jul. 17, 2014

Related U.S. Application Data

(63) Continuation-in-part of application No. 13/301,453, filed on Nov. 21, 2011, now Pat. No. 9,134,348.
(Continued)

(51) Int. Cl.
  *G01R 15/18* (2006.01)
  *G01R 21/133* (2006.01)
  *G01R 22/06* (2006.01)

(52) U.S. Cl.
  CPC ......... *G01R 15/186* (2013.01); *G01R 21/133* (2013.01); *G01R 22/063* (2013.01)

(58) Field of Classification Search
  CPC ..... Y02B 70/1441; Y02B 70/16; H02J 5/005; H02J 7/025; H02M 3/158; H02M 3/1588;
  (Continued)

(56) References Cited

U.S. PATENT DOCUMENTS

| | | |
|---|---|---|
| 2,973,494 A | 2/1961 | Ellis |
| 3,517,311 A | 6/1970 | Wasielewski et al. |

(Continued)

FOREIGN PATENT DOCUMENTS

| | | |
|---|---|---|
| EP | 1703289 | 9/2006 |
| GB | 2338790 | 12/1999 |
| WO | WO-99/43010 | 8/1999 |

OTHER PUBLICATIONS

"Notice of Allowance Dated Jun. 1, 2015; Chinese Patent Application No. 201080025086.3", (Jun. 1, 2015).
(Continued)

*Primary Examiner* — Son Le
*Assistant Examiner* — Dustin Dickinson
(74) *Attorney, Agent, or Firm* — Blakely Sokoloff Taylor & Zafman LLP

(57) ABSTRACT

Apparatus and methods are provided for electrical parameter measurements at points of interest, such as circuit breakers, machines, and the like. The devices which comprise of components that may require corrections, such as the errors induced by, but not limited to, the use of a split core mounted around a current carrier, and hence calibration coefficients are provided based on test, measurements and/or calculations respective of the devices. These coefficients may be stored in a database for retrieval when calibration of measurements received from a measuring device. In one embodiment at least one of the calibration coefficients is stored on the measuring device.

29 Claims, 9 Drawing Sheets

Related U.S. Application Data which is a continuation-in-part of application No. 12/760,867, filed on Apr. 15, 2010, now abandoned.

(60) Provisional application No. 61/169,750, filed on Apr. 16, 2009, provisional application No. 61/272,216, filed on Sep. 2, 2009, provisional application No. 61/802,686, filed on Mar. 17, 2013, provisional application No. 61/492,401, filed on Jun. 2, 2011.

(58) Field of Classification Search
CPC .... H02M 3/1582; H04B 5/0037; H01F 38/14; H01F 2038/146; Y02T 90/122; G01R 33/3628; G01R 15/183; G01R 15/186; G01R 22/063; G01R 21/06; G01R 19/2513

See application file for complete search history.

(56) References Cited

U.S. PATENT DOCUMENTS

| | | | |
|---|---|---|---|
| 3,835,397 A | | 9/1974 | D'Antonio |
| 4,709,339 A | | 11/1987 | Fernandes |
| 4,808,868 A | * | 2/1989 | Roberts .................. H02K 17/28 310/184 |
| 5,006,846 A | | 4/1991 | Granville et al. |
| 5,694,304 A | * | 12/1997 | Telefus .................. H02M 1/38 363/20 |
| 5,962,987 A | | 10/1999 | Statnic |
| 5,995,911 A | | 11/1999 | Hart |
| 6,018,700 A | | 1/2000 | Edel |
| 6,160,697 A | | 12/2000 | Edel |
| 6,259,372 B1 | | 7/2001 | Taranowski et al. |
| 6,417,661 B1 | | 7/2002 | Berkcan et al. |
| 6,433,981 B1 | | 8/2002 | Fletcher et al. |
| 6,470,283 B1 | | 10/2002 | Edel |
| 6,727,684 B2 | | 4/2004 | Hatanaka |
| 6,756,776 B2 | | 6/2004 | Perkinson et al. |
| 6,798,209 B2 | | 9/2004 | Lavoie et al. |
| 6,825,650 B1 | | 11/2004 | McCormack et al. |
| 7,058,524 B2 | | 6/2006 | Hayes et al. |
| D534,120 S | | 12/2006 | Ricci et al. |
| 7,145,322 B2 | | 12/2006 | Solveson et al. |
| 7,242,157 B1 | | 7/2007 | Edel |
| 7,253,602 B2 | | 8/2007 | Shvach et al. |
| 7,282,944 B2 | | 10/2007 | Gunn et al. |
| 7,321,226 B2 | | 1/2008 | Yakymyshyn et al. |
| 7,436,641 B2 | | 10/2008 | Holley |
| 7,453,267 B2 | | 11/2008 | Westbrock, Jr. et al. |
| 7,463,986 B2 | | 12/2008 | Hayes |
| 7,557,563 B2 | | 7/2009 | Gunn et al. |
| 7,561,035 B2 | | 7/2009 | Sahashi et al. |
| 7,876,086 B2 | | 1/2011 | Jansen et al. |
| 8,022,690 B2 | | 9/2011 | Kagan |
| 8,065,099 B2 | | 11/2011 | Gibala et al. |
| 8,190,381 B2 | | 5/2012 | Spanier et al. |
| 8,421,444 B2 | | 4/2013 | Gunn |
| 9,383,394 B2 | | 7/2016 | Banting et al. |
| 2001/0017782 A1 | | 8/2001 | Hickman |
| 2003/0014678 A1 | | 1/2003 | Ozcetin et al. |
| 2003/0155901 A1 | | 8/2003 | Yasumura |
| 2005/0057242 A1 | | 3/2005 | Swain |
| 2005/0132241 A1 | * | 6/2005 | Curt .................. G01R 19/2513 713/300 |
| 2005/0206530 A1 | | 9/2005 | Cumming et al. |
| 2006/0085144 A1 | | 4/2006 | Slota et al. |
| 2006/0119344 A1 | | 6/2006 | Benke et al. |
| 2006/0193152 A1 | * | 8/2006 | Ushijima .......... H02M 7/53838 363/13 |
| 2006/0202667 A1 | | 9/2006 | Klaffenbach et al. |
| 2006/0224335 A1 | | 10/2006 | Borleske et al. |
| 2006/0224336 A1 | | 10/2006 | Petras et al. |
| 2006/0279910 A1 | | 12/2006 | Gunn et al. |
| 2006/0284647 A1 | | 12/2006 | Gunn et al. |
| 2007/0024269 A1 | | 2/2007 | Tadatsu |
| 2007/0059986 A1 | | 3/2007 | Rockwell |
| 2007/0085487 A1 | | 4/2007 | Kuennen et al. |
| 2007/0136010 A1 | | 6/2007 | Gunn et al. |
| 2007/0257647 A1 | | 11/2007 | Chen et al. |
| 2008/0024094 A1 | | 1/2008 | Nishihara et al. |
| 2008/0077336 A1 | | 3/2008 | Fernandes |
| 2008/0084201 A1 | | 4/2008 | Kojori |
| 2008/0088297 A1 | | 4/2008 | Makinson et al. |
| 2008/0116880 A1 | * | 5/2008 | McEachern ........ G01R 19/2513 324/130 |
| 2008/0117014 A1 | | 5/2008 | Waeckerle et al. |
| 2008/0122642 A1 | | 5/2008 | Radtke et al. |
| 2008/0129215 A1 | * | 6/2008 | Boys .................. H03D 3/04 315/209 R |
| 2008/0157904 A1 | | 7/2008 | Dominguez et al. |
| 2008/0172192 A1 | * | 7/2008 | Banhegyesi .......... G01R 22/10 702/61 |
| 2008/0215278 A1 | * | 9/2008 | Colsch ................ H01H 69/01 702/85 |
| 2008/0224892 A1 | | 9/2008 | Bogolea et al. |
| 2008/0266056 A1 | | 10/2008 | Alomar |
| 2009/0051557 A1 | | 2/2009 | Beatty et al. |
| 2009/0112496 A1 | | 4/2009 | Suzuki |
| 2009/0115403 A1 | | 5/2009 | Bernklau |
| 2009/0115509 A1 | | 5/2009 | Minteer |
| 2009/0167291 A1 | | 7/2009 | Richeson et al. |
| 2009/0167547 A1 | | 7/2009 | Gilbert |
| 2009/0207034 A1 | | 8/2009 | Tinaphong et al. |
| 2009/0240449 A1 | | 9/2009 | Gibala et al. |
| 2009/0289506 A1 | | 11/2009 | Harres |
| 2010/0013457 A1 | | 1/2010 | Nero, Jr. |
| 2010/0020579 A1 | | 1/2010 | Melanson |
| 2010/0023283 A1 | | 1/2010 | Boutorabi et al. |
| 2010/0085036 A1 | | 4/2010 | Banting et al. |
| 2010/0153036 A1 | | 6/2010 | Elwarry et al. |
| 2010/0264906 A1 | | 10/2010 | Shamir et al. |
| 2011/0082599 A1 | | 4/2011 | Shinde et al. |
| 2011/0128656 A1 | | 6/2011 | Kohler |
| 2012/0208479 A1 | | 8/2012 | Pistor et al. |
| 2014/0266240 A1 | | 9/2014 | Haensgen et al. |

OTHER PUBLICATIONS

"Notice of Allowance Dated May 7, 2015; U.S. Appl. No. 13/301,453", (May 7, 2015).

"Office Action Dated Feb. 13, 2015; Chinese Patent Application No. 201080025086.3", (Feb. 13, 2015).

"Office Action Dated Feb. 19, 2016; U.S. Appl. No. 14/586,605", (Feb. 19, 2016).

"Office Action Dated Mar. 9, 2016; U.S. Appl. No. 13/924,264", (Mar. 9, 2016).

"Office Action Dated Apr. 26, 2016; United Kingdom Patent Application No. 1321183.4", (Apr. 26, 2016).

"Office Action Dated Jun. 15, 2016; U.S. Appl. No. 15/081,656", (Jun. 15, 2016).

"Office Action Dated Oct. 27, 2014; U.S. Appl. No. 12/760,867", (Oct. 27, 2014).

"Office Action Dated Aug. 12, 2014; U.S. Appl. No. 13/301,453", (Aug. 12, 2014).

"Office Action Dated Aug. 19, 2014; Chinese Patent Application No. 201080025086.3", (Aug. 19, 2014).

"Office Action Dated May 19, 2014; U.S. Appl. No. 13/301,453", (May 19, 2014).

"International Search Report and Written Opinion of the International Searching Authority Dated Aug. 10, 2010; International Application No. PCT/IB2010/000846", (Aug. 10, 2010).

"International Search Report and Written Opinion of the International Searching Authority Dated May 16, 2012; International Application No. PCT/IL2012/00013", (May 16, 2012).

"Notice of Allowance Dated Jan. 14, 2014; United Kingdom Patent Application No. 1307220.2", (Jan. 14, 2014).

"Notice of Allowance Dated Jan. 28, 2014; United Kingdom Patent Application No. 1316868.7", (Jan. 28, 2014).

"Notice of Allowance Dated Jan. 7, 2014; United Kingdom Patent Application No. 1119518.7", (Jan. 7, 2014).

(56) References Cited

OTHER PUBLICATIONS

"Office Action Dated Feb. 19, 2013; United Kingdom Patent Application No. 1119518.7", (Feb. 19, 2013).
"Office Action Dated Feb. 24, 2014; U.S. Appl. No. 12/760,867", (Feb. 24, 2014).
"Office Action Dated Jan. 23, 2013; U.S. Appl. No. 12/760,867", (Jan. 23, 2013).
"Office Action Dated May 2, 2014; U.S. Appl. No. 12/760,867", (May 2, 2014).
"Office Action Dated May 24, 2013; United Kingdom Patent Application No. 1119518.7", (Jul. 24, 2013).
"Office Action Dated May 24, 2013; United Kingdom Patent Application No. 1307220.2", (May 24, 2013).
"Office Action Dated Nov. 11, 2013; Chinese Patent Application No. 201080025086.3", (Nov. 11, 2013).
"Office Action Dated Nov. 8, 2013; U.S. Appl. No. 12/760,867", (Nov. 8, 2013).
"Office Action Dated Oct. 29, 2013; United Kingdom Patent Application No. 1119518.7", (Oct. 29, 2013).
"Office Action Dated Oct. 29, 2013; United Kingdom Patent Application No. 1307220.2", (Oct. 29, 2013).
"Office Action Dated Oct. 29, 2013; United Kingdom Patent Application No. 1316868.7", (Oct. 29, 2013).
"Office Action Dated Sep. 19, 2013; German Patent Application No. 112010001638.0", (Sep. 19, 2013).
"Office Action Dated Sep. 20, 2012; U.S. Appl. No. 12/760,867", (Sep. 20, 2012).
"Office Action Dated Dec. 19, 2016; U.S. Appl. No. 13/924,264", (Dec. 19, 2016).
"Office Action Dated Dec. 22, 2016; U.S. Appl. No. 14/586,605", (Dec. 22, 2016).
ISA—The Instrumentation, Systems, and Automation Society, "ANSI/ISA—61010-1 (82.02.01), CSA C22.2 No. 1010.1, ANSI/UL 61010-1, Formerly ANSI/ISA—82.02.01-1999 (IEC 61010-1 Mod), Safety Requirements for Electrical Equipment for Measurement, Control, and Laboratory Use", Section 10.1, (Jul. 12, 2004), p. 94.
"Office Action Dated Jul. 19, 2016; U.S. Appl. No. 13/924,264", (Jul. 19, 2016).
"Office Action Dated Jul. 26, 2016; U.S. Appl. No. 14/586,605", (Jul. 26, 2016).
"Office Action Dated Jun. 21, 2016; U.S. Appl. No. 15/081,666", (Jun. 21, 2016).
"Office Action Dated Oct. 7, 2016; United Kingdom Patent Application No. 1321183.4", (Oct. 7, 2016).
"Office Action Dated Sep. 30, 2016; U.S. Appl. No. 14/841,117", (Sep. 30, 2016).
The Great Soviet Encyclopedia, "Magnetization Curve", downloaded from http://encyclopedia2.thefreedictionary.com/Magnetization+Curve, (1979), 2 pp. total.
"Applicant-Initiated Interview Summary Dated Feb. 7, 2017; U.S. Appl. No. 13/924,264", (Feb. 7, 2017).
"Decision to Grant Dated Mar. 21, 2017; German Patent Application No. 112010001638.0", (Mar. 21, 2017).
"Intention to Grant, United Kingdom Patent Application No. 1321183.4", (Apr. 5, 2017).
"Intention to Grant, United Kingdom Patent Application No. 1701306.1", (Apr. 27, 2017).
"Intention to Grant, United Kingdom Patent Application No. 1701307.9", (Apr. 27, 2017).
"Notice of Allowance Dated Apr. 14, 2017; U.S. Appl. No. 14/841,117", (Apr. 14, 2017).
"Notice of Allowance Dated Feb. 24, 2017; U.S. Appl. No. 15/081,666", (Feb. 24, 2017).
"Notice of Allowance Dated Feb. 9, 2017; U.S. Appl. No. 15/081,656", (Feb. 9, 2017).
"Notice of Allowance Dated Mar. 22, 2017; U.S. Appl. No. 14/586,605", (Mar. 22, 2017).
"Notice of Allowance Dated Mar. 28, 2017; U.S. Appl. No. 13/924,264", (Mar. 28, 2017).
"Office Action Dated Feb. 20, 2017; United Kingdom Patent Application No. 1321183.4", (Feb. 20, 2017).
"Office Action Dated Feb. 20, 2017; United Kingdom Patent Application No. 1701306.1", (Feb. 20, 2017).
"Office Action Dated Feb. 20, 2017; United Kingdom Patent Application No. 1701307.9", (Feb. 20, 2017).
"U.S. Appl. No. 61/103,603, filed Oct. 8, 2008", (Apr. 8, 2010).

* cited by examiner ability# APPARATUS AND METHODS THEREOF FOR ERROR CORRECTION IN SPLIT CORE CURRENT TRANSFORMERS

CROSS-REFERENCE TO RELATED APPLICATIONS

This application claims the benefit of U.S. Provisional Patent Application No. 61/802,686, filed on Mar. 17, 2013, and is a continuation-in part of U.S. patent application Ser. No. 13/301,453, filed Nov. 21, 2011, which claims the benefit of U.S. Provisional Patent Application No. 61/492,401 filed Jun. 2, 2011, and is a continuation-in-part of U.S. patent application Ser. No. 12/760,867 filed Apr. 15, 2010, which claims the benefit of U.S. Provisional Patent Application No. 61/169,750 filed Apr. 16, 2009 and U.S. Provisional Patent Application No. 61/272,216 filed Sep. 2, 2009, all of which are included herein by reference for all that they contain.

BACKGROUND OF THE INVENTION

1. Field of the Invention

This invention generally relates to the measurement of power consumption and more specifically for calibration and error correction of split core current transformers used in non-intrusive and self-powered measurement devices.

2. Prior Art

In a typical electricity distribution system, power is provided through a main circuit breaker and a device for measurement of the power consumption of the entire electrical network connected thereto. However, typically, the main power line is then connected to a plurality of circuit breakers, each feeding a smaller section of the electrical network with its specific power requirements. The circuit breaker is adjusted to the amount of maximum current that may be used by this electrical sub-network. In industrial and commercial applications, hundreds of such circuit breakers may be installed, each controlling a section of the electrical network. Even in smaller locations, such as a house, it is not unusual to find tens of circuit breakers controlling various electrical sub-networks.

Non-intrusive measurement of current through a power line conductor has well known principles. A current transformer (CT) of sorts is created that comprises the primary winding as the power line conductor and the secondary providing an output current inversely proportionate to the number of windings. Typically such systems are used for measuring currents in very high voltage or current environments, for example, as shown in Gunn et al. in U.S. Pat. No. 7,557,563. These types of apertures are useful for main power supplies. Using such devices, or power meters for that matter, is deficient for the purposes of measuring relatively low currents in an environment of a plurality of circuit breakers. Providing wireless telemetry on a singular basis, such as suggested by Gunn et al., and other prior art solutions, suffers from deficiencies when operating in a noisy environment.

Split cores are used when non-intrusive installation is required, i.e., there is a need or requirement not to disconnect electrical wires when installing a CT. A split core is comprised of two parts that are positioned to fit each other to create a full core. A major problem with split core CT's is that the measurement result is highly sensitive to the air-gap that always exists between the two parts of the core. Due to production tolerances, there may be significant variations in the measurement result between seemingly like cores due to miniature variations (at an order of magnitude of tens of micro-meters) between their air-gaps. As a result, such CT's cannot be practically used in applications requiring a high level of accuracy, such as, for example, revenue grade utility metering. Other sources of inaccuracy in CTs (not necessarily limited to those having a split core) are the number of winding which varies due to tolerances of the winding process, variations in the core cross section dimensions and magnetic material properties.

When using CT's to measure current, such inaccuracies are manifested in variations in the coupling factor, i.e., the ratio between primary and secondary signal amplitude, phase error, i.e., the phase shift between primary and secondary signal amplitudes, and temperature error coefficients, i.e., measurement errors due to variations in temperature. Several solutions have been proposed to the problem some of which involve manually configurable mechanical parts (such as variable resistors) assembled as part of the CT to tune the device. Others proposed solutions that include a matrix of passive components such as resistors, capacitors, and/or inductors, assembled as part of the CT. Such passive components are added and/or removed to tune the device.

There is a need in the art that is now developing, resulting from the move toward energy conservation and need to increase operational efficiency to enable measurement and analysis of power consumption on a fine granularity at the device or circuit level. It would be advantageous if a solution may be provided for calibration of CT's that is simple, cost effective and easy to maintain over long periods of time where the equipment is installed.

DETAILED DESCRIPTION OF THE PREFERRED EMBODIMENTS

Apparatus and methods are provided for the measurement of power consumption at points of interest, such as circuit breakers, machines and the like. Accordingly, means are provided for measurement of power consumption for each electrical sub-network that is controlled by a circuit breaker. Each apparatus is enabled to communicate its respective data, in an environment of a plurality of such apparatuses, to a management unit which is enabled to provide finer granularity power consumption profiles. Challenges of measuring relatively low supply currents, wireless operation in an environment of a large number of apparatuses, and self-powering are addressed.

Figure 1:
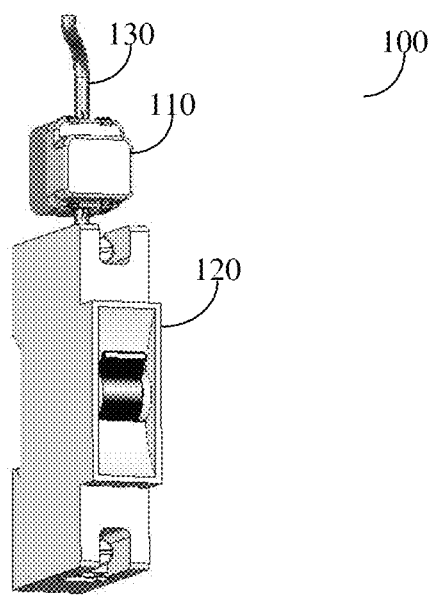
FIG. 1 is a circuit breaker equipped with a compatible self-powered power sensor deployed in accordance with the invention.

Reference is now made to FIG. 1 where an exemplary and non-limiting system 100 is equipped with a compatible self-powered power sensor (SPPS) 110 deployed in accordance with the invention. The SPPS 110 is designed to fit either above or below the circuit breaker 120 which is of standard size such that it fits into current circuit breaker closets without modification. The SPPS 110 housing is designed, as discussed in further detail below, to wrap around the power line 130 leading to or going out of the circuit breaker 120. The SPPS 110 is designed to enable easy installation at an existing location or otherwise during construction when the entire electrical network is put in place. The SPPS contains an electrical circuit described in greater detail with respect of the exemplary and non-liming circuits shown in FIGS. 6, 7 and 8.

Figure 2:
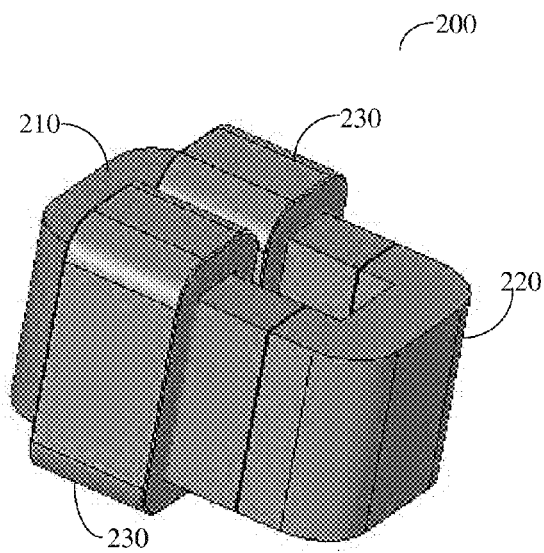
FIG. 2 is a 3D schematic diagram of a core with the secondary winding.
Figure 3A:
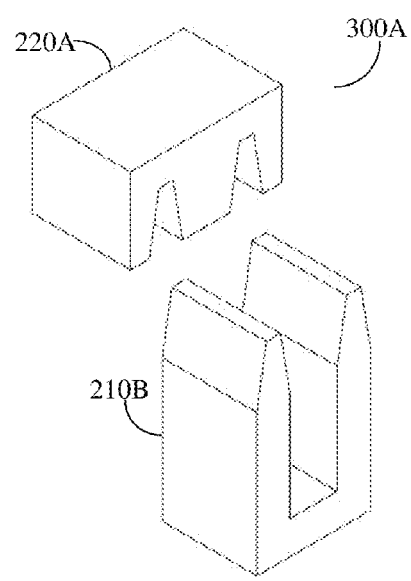
FIG. 3A is a first 3D schematic diagram of the two parts comprising the core.
Figure 3B:
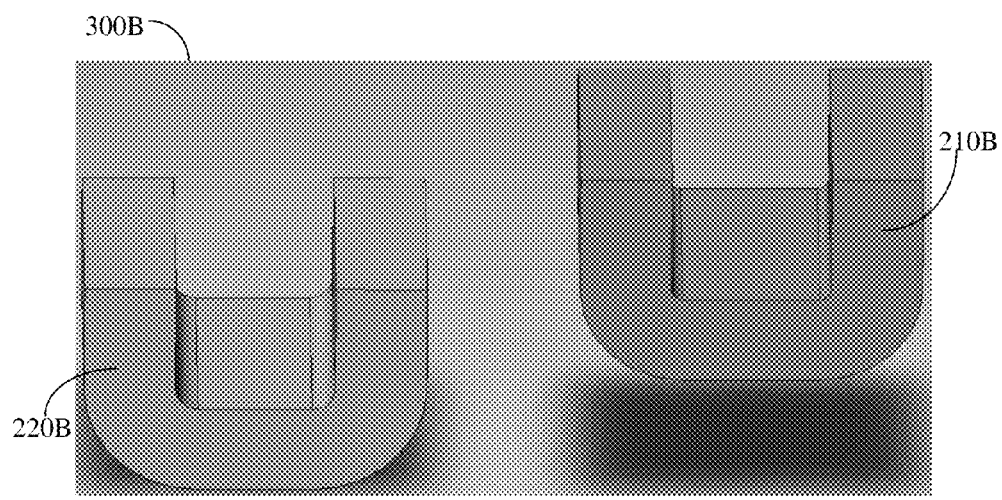
FIG. 3B is a second 3D schematic diagram of the two parts comprising the core.
Figure 4A:
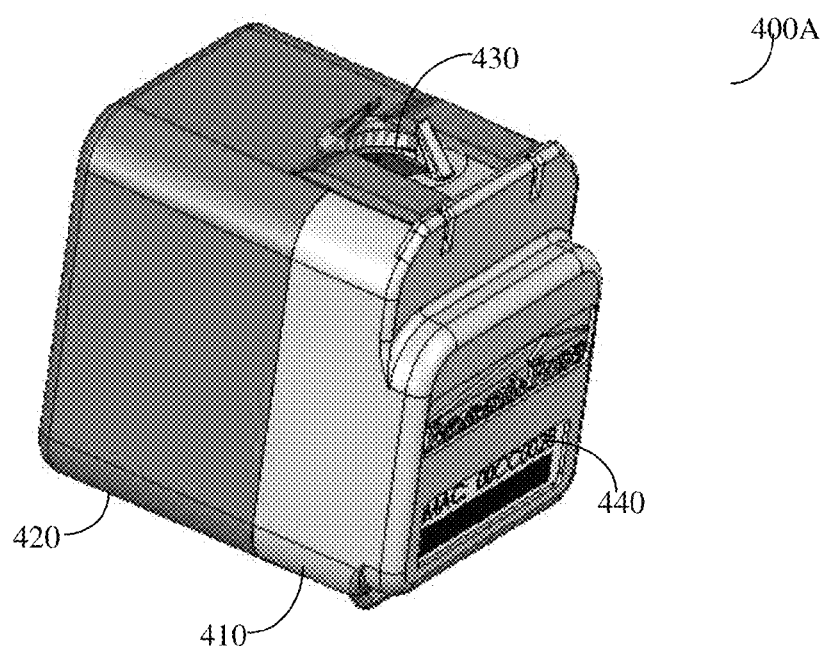
FIG. 4A is a 3D schematic diagram of a closed housing of a self-powered power sensor implemented in accordance with the invention.
Figure 4B:
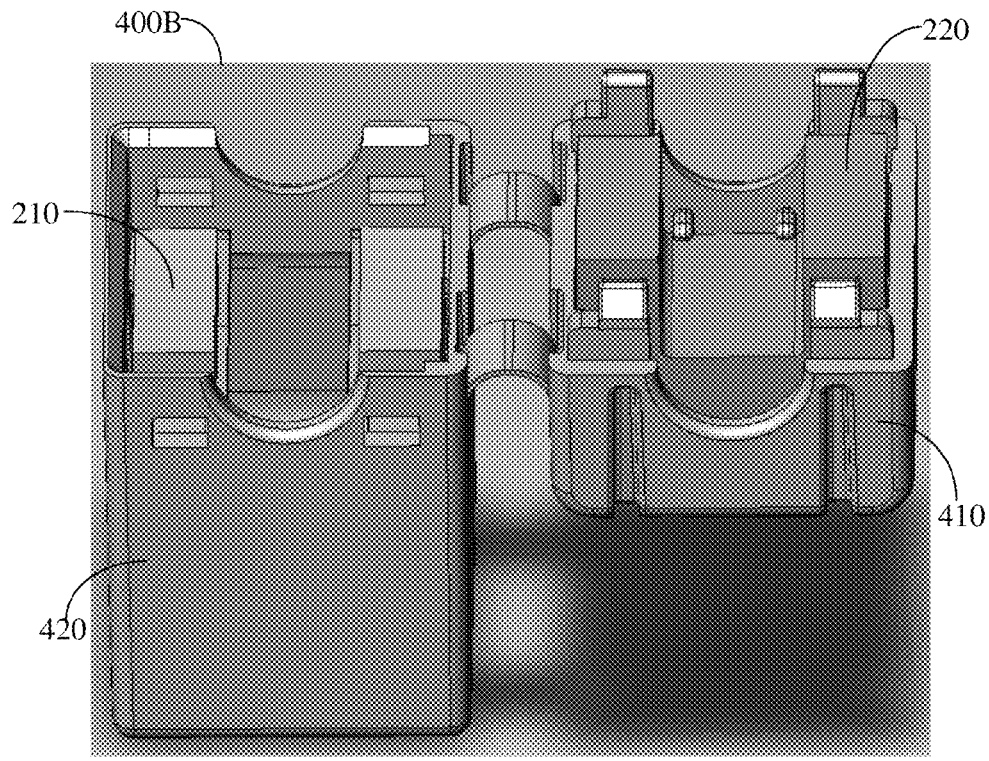
FIG. 4B is a 3D schematic diagram of an opened housing of a self-powered power sensor implemented in accordance with the invention.

FIGS. 2, 3A and 3B show schematic 3D (three dimensional) diagrams 200, 300A and 300B of a core with the secondary winding and the core separated into two parts and used with respect of a current transformer (CT) discussed in additional detail herein. The core is comprised of two parts 210 and 220 that are separable from each other, however, as shown in FIGS. 3A and 3B, they may be designed in different ways so as to ensure that when they are assembled they provide good magnetic flow through the core by reducing the air-gap between the two parts to minimum, for example 10 μm. While an exemplary shape of the two portions of the core is shown these are merely for explanation purposes and other designs are possible to achieve the required results. It is essential, as explained herein above, that the core fit in the dimensions allotted in the SPPS 110 so that it can properly fit in an electricity closet in conjunction with a circuit breaker and the diameter of the power line 130. The secondary windings 230 of a current transformer according to an embodiment are wound on one of the sections of the core, for example, section 210 which is the stationary section that is placed in the exemplary and non-limiting 3D schematics of housing 400 shown with respect of FIGS. 4A and 4B in a closed (400A) and opened (400B) state. In one embodiment there may be two windings connected in series, of two independent secondary windings (see FIG. 2 element 230) or a single secondary winding (see FIG. 4B). The moveable section of the core, for example section 220, is placed in section 410 of the housing 400 which is separable from section 420 of the housing 400, in which section 210 is placed. When separating section 410 from section 420 (as shown, for example, in FIG. 4B) it is possible to place them around power line 130 so that when the sections 410 and 420 are reconnected the power line 130 is placed within the core perimeter thereby completing a current transformer. In an embodiment each SPPS 110 is assigned a unique identification (ID), for example a MAC address that maybe 16 bytes in length, that is placed on the housing 400 at, for example, location 440. At installation of the SPPS the MAC address is read by a technician installing the system for configuration purposes. In one embodiment machine readable code is provided, e.g., barcode, to enable automatic reading using a reader. While a core comprising of two sections is described hereinabove, it should be noted that other implementations for a core are possible without departing from the scope of the invention. In one embodiment a single section core is used and in such a case the primary line must be inserted through the hole in the core. It may require disconnection of the line and threading it through the core for mounting the SPPS device. In one embodiment of the invention the minimum number of windings in the secondary coil is 500.

Figure 5:
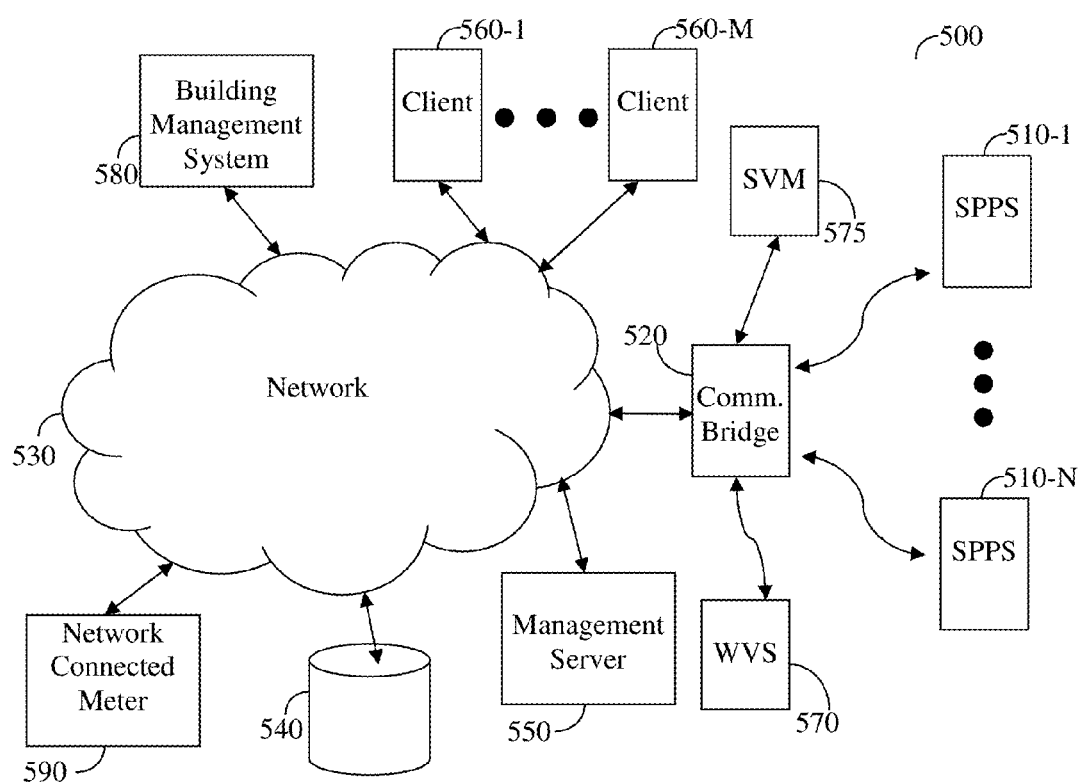
FIG. 5 is a schematic diagram of a system configured in accordance with the invention.

Reference is now made to FIG. 5 where an exemplary and non-limiting system 500, configured in accordance with the principles of the invention, is shown. The system comprises a plurality of SPPS 510 communicatively coupled to a communication link 520. The SPPS 510 may be placed in an electrical closet before or after respective circuit breakers or, at the input to specific power consuming units. The management server is equipped with a transceiver enabling the communication with the plurality of SPPS 510 using one or more of the communication schemes discussed herein above. The communication bridge 520 is configured to communicate with those SPPSs 510 it is configured to operate with, using for identification their respective MAC addresses. The communication bridge 520 is coupled to a network 520 which may be, but is not limited to, a local area network (LAN), a wide area network (WAN), a metro area network (MAN), the Internet, the world wide web (WWW), the likes and combinations thereof. The communication link can be, but is not limited to, a WLAN (Wireless LAN), for example 802.11 also known as WiFi, a wireless sensor area network, for example 802.15.4 also known as Zigbee, power line communication (PLC), or a cellular to modem network such as GPRS or CDMA. In one embodiment of the invention the communication bridge collects the data from the plurality of sensors 510-1 to 510-N prior to sending it to the network. To the network there are coupled a database 540 to accumulate data collected by the communication bridge 520. The communication bridge 520 may be placed in each closet and aggregate a plurality of SPPS 510 communications. Further coupled to the network is a management server 550 that based on the data accumulated in database 540 may provide a client 560 processed information respective of the collected data as well as communicate with other application software, for example building management systems (BMSs).

The communication bridge 520 may be further configured to communicate wired or wirelessly with a standard voltage meter (SVM) 575 and/or a wireless voltage sensor (WVS) 570 respectively. In one embodiment of the invention a network connected meter 590 may be used for the purpose of measuring voltage at a desired location. Such measurements may be used to further determine the power factor is explained in more detail herein below. The system 500 may be further connected via the network 530 to a building management system (BMS) 580 that is used in a building to create a central computer control, monitor and optimization of facilities of the building such as, but not limited to, air-conditioning, lighting and security. The BMS 580 allows for easier operation of facilities and enables the reduction of energy waste.

Figure 6:
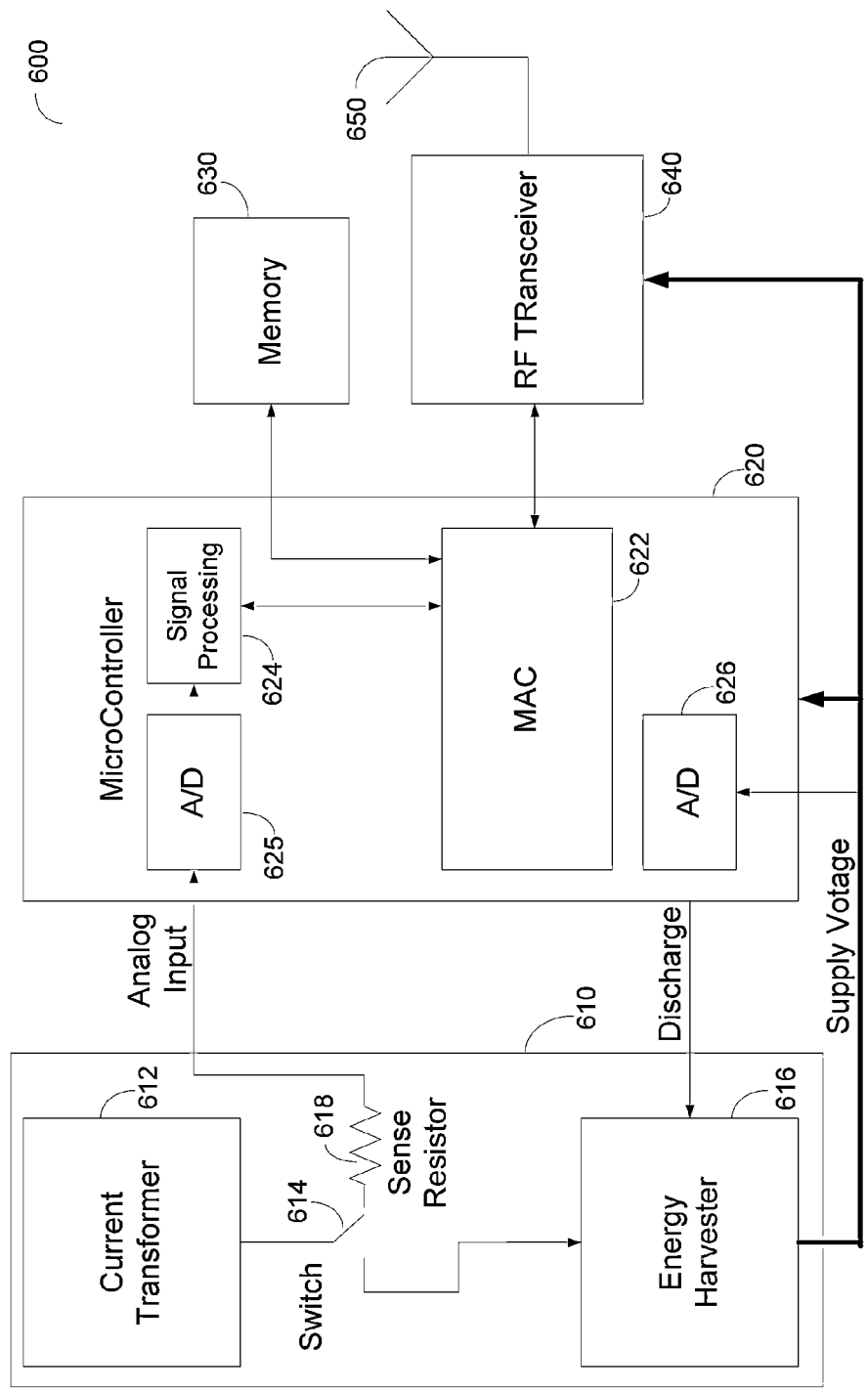
FIG. 6 is a block diagram of an embodiment of a self-powered sensor in accordance with the invention.

Reference is now made to FIG. 6 where an exemplary and non-limiting embodiment of a circuit 600 within a SPPS 510 is shown. The circuit 600 comprises an analog section 610 that is coupled to a microcontroller 620. The analog section 610 comprises a current transformer 612 that transforms current from the power line, for example power line 130, to a lower current, an energy harvester 616, a switch 614 and a sense resistor 618. The current transformer 612 is used for two purposes: the first is to provide the power needed for the operation of the SPPS 110 and the second is to sense the actual power consumption of the load connected to the power line 130.

The circuit 600 further comprises a MCU 620 that is comprised of several components. An analog to digital converter (A/D) 625, that is coupled to a signal processor 624 which is further coupled to a media access control (MAC) unit 622 that supports the communication protocol of the SPPS. The MAC 622 provides the data link layer of the seven-layer standard model of a communication system. This involves the creation in hardware, software, or firmware or any combination thereof, of data frames, timing their transmission, received signal strength indication (RSSI), acknowledgements, clock synchronization etc. Another A/D converter 626 is used to measure the output of the energy harvester 616, and in one embodiment, under control of MCU 620, to cause a discharge thereof as may be needed and as further explained below. In another embodiment, further explained herein below, it can be used to detect that the load connected to the measured power line was turned off. A memory 630 is coupled to the MCU 220 that can be used as scratch pad memory 630 as well as memory for storage of the plurality of instructions that when executed by the MCU 620 executes the methods discussed herein. Memory 630 may comprise random access memory (RAM), read only memory (ROM), non-volatile memory (NVM), other memory types and combinations thereof.

A radio frequency (RF) transceiver 640 is coupled to the MCU 620 and to an antenna 250 to provide one or two-way communication with a communication bridge 530, discussed in more detail below. In one embodiment of the invention the RF transceiver 640 supports transmission only, i.e., uplink communication. However, the RF transceiver 640 may comprise a receiver portion to support features such as, and without limitation, sensing for a carrier signal, clock synchronization, acknowledgement, firmware download, and configuration download. Typically, this should be operative in an unlicensed communication band, such as an unlicensed industrial scientific medical (ISM) band, operative, for example and without limitation, at 2.4 Ghz. In one embodiment some form of spread-spectrum modulation technique may be used, for example and without limitation, direct sequence spread spectrum (DSSS), to enable better coexistence with other systems working in the same environment. The communication rate, discussed in more detail below, should be high enough to enable coexistence of a couple of hundred SPPSs in the same electrical closet. The power consumption of the RF transceiver 240 should be low enough to adhere with the energy harvesting limitations. Yet another requirement of the RF transceiver 640 is to support a communication range sufficient to operate in an electrical closet, e.g., 3-4 meters metallic reach environment. In another embodiment of the invention the range may reach up to a few tens of meters in an indoor environment. This enables the placing of SPPSs on individual devices, e.g., on machines in a production line of a factory, and a minimum number of bridge units in the area. The RF transceiver 640 preferably uses a standard PHY layer supporting, for example and without limitations, IEEE 802.15.4, and/or communication protocol, for example and without limitation, Zigbee. Use of such standards enables easy integration with existing systems that already include wireless hardware, for example and without limitations, smart meters.

In normal operation the switch 614 is positioned to enable energy harvesting by the energy harvester 616. Periodically, for example under the control of the microcontroller 620, the switch 614 is activated to connect the secondary winding of transformer 612 through the sense resistor 618, typically having a low resistance in order to enable the current transformer 612 to operate in its linear range. The voltage on the sense resistor 618 is sampled by the ADC 625. The voltage is sampled several times in each cycle in order to calculate the average voltage (RMS) or in order to identify the voltage peak, both provide an indication to the power flowing through the primary wire 130. The switch 614 is toggled between the two positions to enable energy harvesting most of the time in a first position (connected to the energy harvester 616), and measurement of the voltage periodically when in the second position (connected to the sense resistor 618). The sampling is averaged over a number of cycles and divided by the resistance value of the sense resistor 618 to provide the secondary current value. The primary current can then be calculated by multiplying in a coupling factor, which is approximately the number of secondary windings. The current value can then be multiplied by a time interval to obtain the total charge value, for example, in Ampere Hours. Some of these calculations can be done by either the MCU 620, in the communication bridge 520 or at the management server 550. In the same manner, a calibration factor can also be used with respect of circuit 600 in order to overcome the production tolerances of the current transformer 612, such ones that are caused by a variation in the air gap between the two parts of the core 300, as would be now readily appreciated by those of ordinary skill in the art. The calibration mechanism will be further discussed herein and is of great significance to the present invention.

Figure 7:
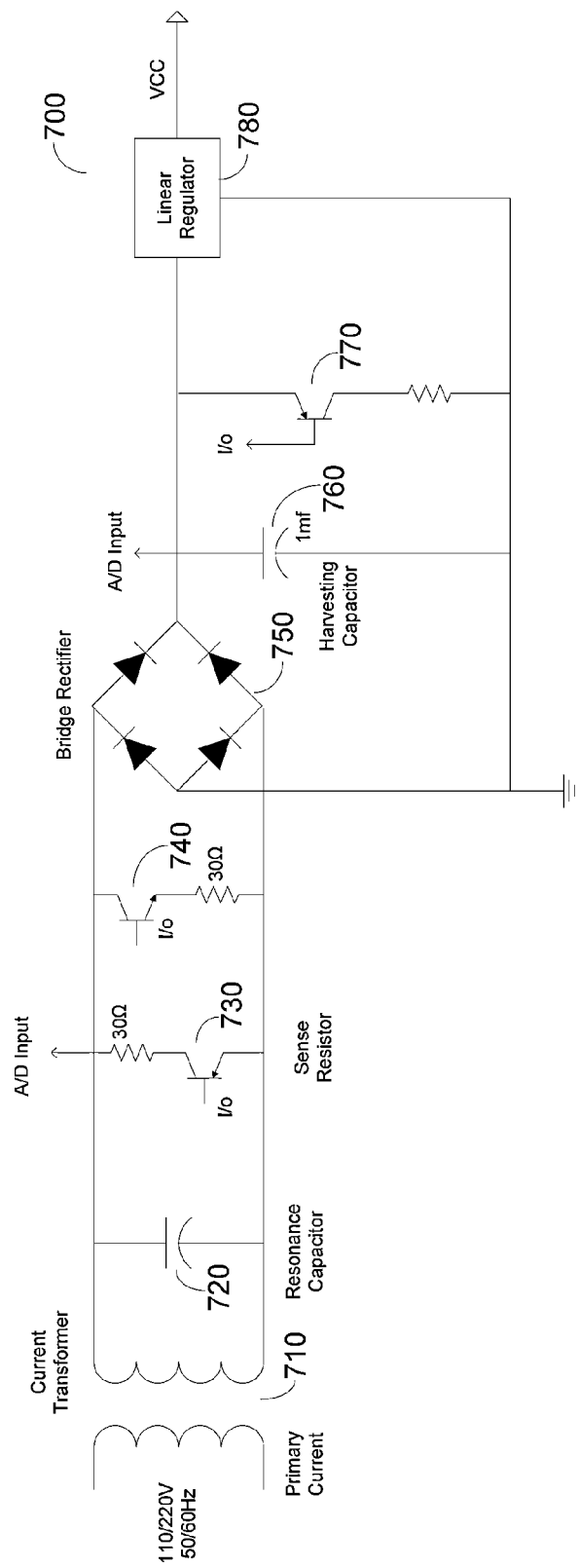
FIG. 7 is a circuit diagram of a first embodiment of the analog portion of the self-powered sensor in accordance with the invention.

The analog section may be implemented as shown in the exemplary and non-limiting circuit diagram 700 of FIG. 7. Normally, the switches 730 and 740, connected between the resonance capacitor 720 and the bridge rectifier 750 are off, so that the harvesting capacitor 760 is charged. The primary winding of the current transformer 710 is the power line 130 and its AC current induces voltage and current in the current transformer 710. When the switches 730 and 740 are off, the induced voltage resonates with the resonance capacitor 720 to produce sufficient voltage to pass through the diode bridge 750. In the case where Schottky diodes are used for the diode bridge 750 this voltage is approximately 0.3V. At the output of the diode bridge a rectified DC current is provided which charges the harvesting capacitor 760 until it reaches a voltage that is sufficient to activate the linear regulator 700, which in turn provides enough voltage that switches on the MCU 600. Voltage of the harvesting capacitor 760 is limited to avoid overcharge by switch 770. To perform a measurement the microcontroller 620 switches the transistors 730 and 740 on using their respective I/O ports. According to the principles of the invention switches 730 and 740 are operated simultaneously in opposite phases. Use of the two switches 730 and 740 and respective two resistors prevents DC load on the transformer 710. This is required to avoid saturation and distortion of the measurement results. It would be appreciated by those skilled in the art that one switch conducts in the positive part of the cycle, and the other switch conducts in the negative part of the cycle. It should be noted however that topologies using a single switch which can symmetrically conduct in both directions are possible, for example, by using a pair of MOSFET transistors connected in series. When the switches 730 and 740 are active, the current flows through the appropriate sense resistor instead of charging the harvesting capacitor 760. According to the invention, the sense resistors have a low impedance relative to the self-resistance of the transformer coil. This enables a close to short circuit current flow, keeping the voltage across the resistor low enough thus maintaining minimal flux across the core and avoiding saturation of the transformer 710. This is also useful in order to reduce the induced voltage into the levels required by the dynamic range of the A/D 626. In one embodiment of the invention, after switching on the sense resistors, the MCU 620 waits a certain time interval, typically a couple of hundreds of milliseconds, or switch to an off/power save mode, before performing the measurement, in order to allow for the resonance capacitor to discharge. Typically, where the US alternate current cycle time is 18 mSec, a period of 200 mSecs is about 11 cycles which ensures reduction of the resonance capacitor voltage to a steady state. This ensures high accuracy and better linearity of the measurement results. In accordance with the principles of the invention, in cases where it is possible to use two coils, a first current transformer is used to measure the voltage using the ADC 625 while current transformer is used for the purpose of energy harvesting, thereby eliminating the need for switching at the expense of a potential increase in size of the SPPS 510. The value of the sense resistors respective of 730 and 740 may be easily calculated. Assuming the SPPS 510 is designed for a maximum primary current of 30 A then with N=1000 the maximum short circuit current of the secondary winding would be 30 mA. If the maximum input to the ADC 225 is 1V then the sense resistor is to be 30Ω. The resistance of a thin, e.g., 0.1 mm, copper wire with 1000 windings at typical dimensions of the SPPS is approximately 100Ω.

The resonance capacitor 720 resonates with the current transformer coil in order to produce a sufficiently large voltage to pass through the diode rectifier. Since the magnetization curve of a typical core is nonlinear at low primary currents, the effective inductance of the core varies with primary current. In one embodiment of the invention, it is beneficial to select the resonance capacitor's value so that maximum resonance is achieved at low primary currents. This produces the required voltage swing to pass through the diode bridge even at very low primary currents.

Key to the operation of the SPPS 110 is that it is capable of addressing several critical challenges to its successful operation. Three key issues are the minimum power detection of the current transformer 612, the power balance of the circuit 600, and wireless coexistence in an environment of a plurality of SPPSs 110 that may include several hundreds of SPPSs. In order for an SPPS 110 to be a useful device it is necessary that it be capable of detecting as low as possible currents flowing through the primary lead 130. The design must take into consideration the limited space typically available for an apparatus such as, but not limited to, SPPS 110 that must fit dimension restrictions of the circuit breaker 120. In other embodiments of the invention other size restrictions may apply, however these should not be viewed as limiting the scope of the invention. Inductance of the secondary winding is approximately:

$$L = \frac{\mu_0 \mu_r N^2 A}{l}$$

where N is the number of windings, $\mu_r$ is the relative permeability of the magnetic material, such as, and not limited to, strip wound iron, $\mu_0$ is the permeability of free space, A is the cross section of the core, further discussed with respect of FIGS. 2 and 3 below, and l is the effective length of the core. For N=1500, $\mu_r$=1000, $\mu_0$=4π10$^{-7}$, A=40 mm$^2$, and l=20 mm, the inductance is L=5.5 Hy. The current ratio between the secondary current $I_s$ and the primary current $I_p$ is approximately, for an ideal transformer, $I_p/I_s$=N. The voltage on the secondary coil is given by $V_s=I_s\omega L=I_p\omega L/N$, and at f=50 Hz ω=2πf=314 rad/sec. Therefore, $V_s=I_p\omega L/N=1.15I_p$. Assuming a 1V drop over the diode rectifier, for example diode rectifier 750, and charge voltage of 1V then at least 2V are needed in order for the system to operate. Hence, there is a minimum detectable current of 2/1.15=1.7 A peak=1.2 A RMS. Using the resonance capacitor, for example resonance capacitor 720, the impedance is decreased by a factor of $1/(X_L-X_C)$ where $X_L$ is the impedance of the core and $X_C$ is the impedance of the resonance capacitor. Taking an accumulative tolerance of ±20% for the capacitance and inductance, results in a worst case of 40% increase in signal, and hence the minimum detectable current is, in this exemplary case, 1.2×0.4=0.48 A, which represents a minimum detectable power of 105 VA at 220V. At 110V 60 Hz, the minimum detectable current in the exemplary case is 5/6×0.48=0.4 A and a minimum detectable power of 44 VA. Since L is proportional to N$^2$ and to A and V is proportional to 1/N, the minimum detectable current may be decreased by increasing either N or A. However, it is essential to ensure that the entire core, and its respective secondary winding, fit in the size constraints of SPPS 110, and an increase of N or A may have a material effect thereon.

Furthermore, to make the SPPS 110 an operative device it is essential to ensure that a sufficient amount of power is made available through the operation of the circuits discussed hereinabove. Following is an exemplary and non-limiting analysis thereof. Firstly, it is essential to understand the energy requirements of each of the key components: the transmission cycle, the sensing cycle and the logic operation. Failure to address these issues may result in non-operative circuits. In all cases the assumption is for a 3V operation. For the transmission cycle a transmission current of 20 mA is used for a period of 5 mSec. A processing current of 1 mA is used during a 10 mSec period of wakeup and processing. Therefore the total energy requirements for the transmission cycle is: 3V×(20 mA×5 mSec+1 mA×10 mSec)=0.33 mJ. For sensing the secondary voltage using the A/D, a processing current of 1 mA is used for a wakeup and processing period of 20 mSec (20 mSec represents a complete period of 50 Hz). Therefore the energy requirements for this counting cycle are: 3V×1 mA×20 mSec=60 μJ. Lastly, the logic operation (such as needed to switch between sensing and harvesting modes) requires a continuous current of 50 μA, resulting in a continuous power consumption of: 3V×0.05 mA=150 μW. The total energy has to be supplied reliably by the energy harvester for example, circuit 616. It is therefore necessary that the harvesting capacitor, for example reservoir capacitor 760, provide sufficient energy for the performance of the desired operations. The above assumptions are typical for common low power MCUs and radio frequency integrated circuits (RFICs).

To address the energy balance of the circuit 600 it is necessary to ensure that the harvesting capacitor, for example harvesting capacitor 760, is capable of supplying sufficient energy for the transmission cycle, several sampling cycles and the logic operation. Both are addressed in the following exemplary and non-limiting calculations. Assuming a harvesting capacitor, for example capacitor 760, having a value of 0.375 mF, the capacitor being charged to $V_1$=5V and discharged to $V_2$=3V, then the total energy is: E=0.5 $C_2×(V_1^2-V_2^2)$=3 mJ. A previous calculation has shown that the transmission cycle consumes around 0.33 mJ and that each sampling cycles consumes 0.06 mJ. Therefore, counting 10 sampling cycles and one transmission cycle requires about 0.93 mJ of energy, which is less than 30% of the available energy in the harvesting capacitor.

In order to ensure proper operation of the circuit 600 it is necessary to ensure a positive energy balance for continuous system operation even at the lowest primary currents. It is therefore necessary to calculate the power in to the system versus the power out of the system, the later having to be smaller than the earlier. For the power in, at a primary current $I_p$=0.5 A and N=1500 results in a secondary current of $I_s$=0.33 mA. Using the same figures as above, i.e., a harvesting capacitor of 0.375 mF, discharge voltage down to 3V and charge voltage of 5V, the charge time is T=C$\Delta$V/$I_s$=2.2 Sec. The available energy of 3 mJ therefore provides 3/2.2=1.36 mW. Assuming 80% DC/DC efficiency, the available power in is about 1 mW. The power out is a combination of the continuous logic operation, the sampling process and the transmission. The continuous logic operation requires 150 μW as shown above. Sampling 10 cycles in, say, every 2 seconds requires 10×60 μJ=600 μJ over a period of 2 Sec which is equivalent to 300 μW. Assuming a transmission once every 10 seconds then 330 μJ are required every 10 seconds which are 33 μW. The total power consumption is therefore 783 μW which is less than the 1 mW available as explained herein above. It should be noted that a higher primary current results in an improved power balance that enables an increase of the transmission frequency, as well as the sampling frequency, storing energy for times when no primary current exists, and combinations thereof.

Figure 8:
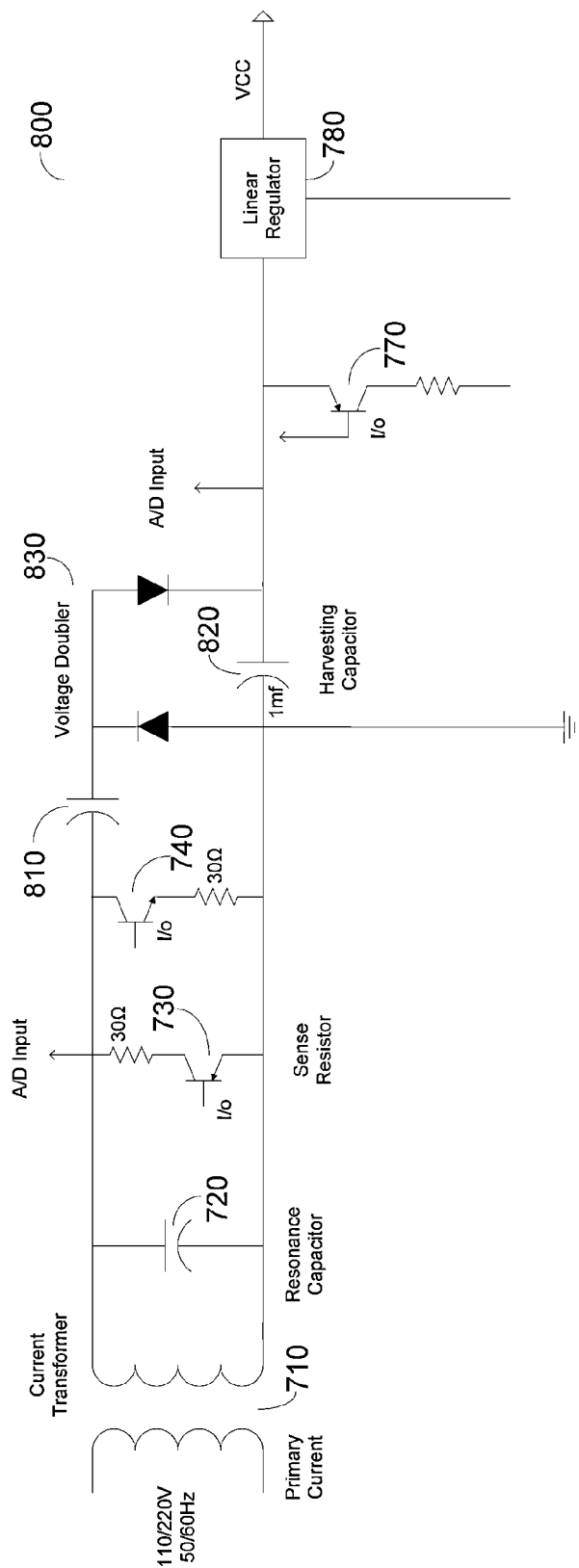
FIG. 8 is a circuit diagram of a second embodiment of the analog portion of the self-powered sensor in accordance with the invention.

In yet another exemplary embodiment of the analog section circuit 800, shown in FIG. 8, a voltage doubler 830 is used. In fact, the bridge rectifier described herein above can be replaced by a voltage multiplier. A person skilled in the art would readily note that the voltage multiplier may be a voltage doubler, tripler, quadrupler or any other type of passive voltage multiplier topology, without departing from the scope of the invention. The exemplary and non-limiting circuit 800 shows a simple implementation of a voltage doubler 830. The voltage on the harvesting capacitor 820 is double the voltage on the transformer 710 after resonance. In some cases the use of a voltage multiplier is advantageous at the lower current range. Also, specifically referring to the sense resistor topology, the voltage multiplier simplifies the grounding of the circuit as a common ground can be connected to the harvesting capacitor and the sensing resistor, whereas when using the bridge rectifier a differential voltage measurement needs to be made.

Accordingly the following steps are suggested for operation with respect of the exemplary and non-limiting system 500 described hereinabove with respect of FIG. 600. Normally, the SPPSs 510 transmit a true root mean square (RMS) current value. The RMS current value is calculated in the system 600 by checking every t interval if enough charge exists in the harvesting capacitor, e.g., capacitor 760, and if so switching from harvesting mode into sense mode where CT 612 is connected serially to the sense resistor 618 as shown in FIG. 6; otherwise, wait an additional period in harvesting mode and repeat; then, wait a relaxation period in sense mode to discharge the resonance capacitor 720, typically in the range of ~150 mSec; Alternatively, the switching can be timed to the zero crossing of the signal to avoid the resonance capacitor discharge; Sample n periods of the secondary signal at a rate of Y samples per second, in the above sense mode (measuring the secondary signal over the sense resistor), where typical but non-limiting values are: every second, sample 5 periods at 64 samples per period; Upon completion of the samplings switch back to harvesting mode; and, Repeat the process described above N times or otherwise repeat until a timeout T elapses. Typical but not limiting values are 60 repetitions or until 1 minute passes. Subsequently, for each period sampled, the samples vector is used to calculate true RMS value of that vector; Averaging the RMS values where there are n×N values; Optionally, multiply the result by a calibration factor, or operate other calibration function(s), to obtain the required units, e.g., primary amp, milliamp, etc.; Checking if enough energy exists to transmit by sampling the reservoir capacitor and if so transmitting the result which is representing of the average current; Optionally, a carrier sense mechanism, e.g., 'listen before talk', is used to check if the air is free for transmission as described in the exemplary and non-limiting FIG. 9; otherwise, waiting for another period in harvesting mode and repeating the check.

Figure 9:
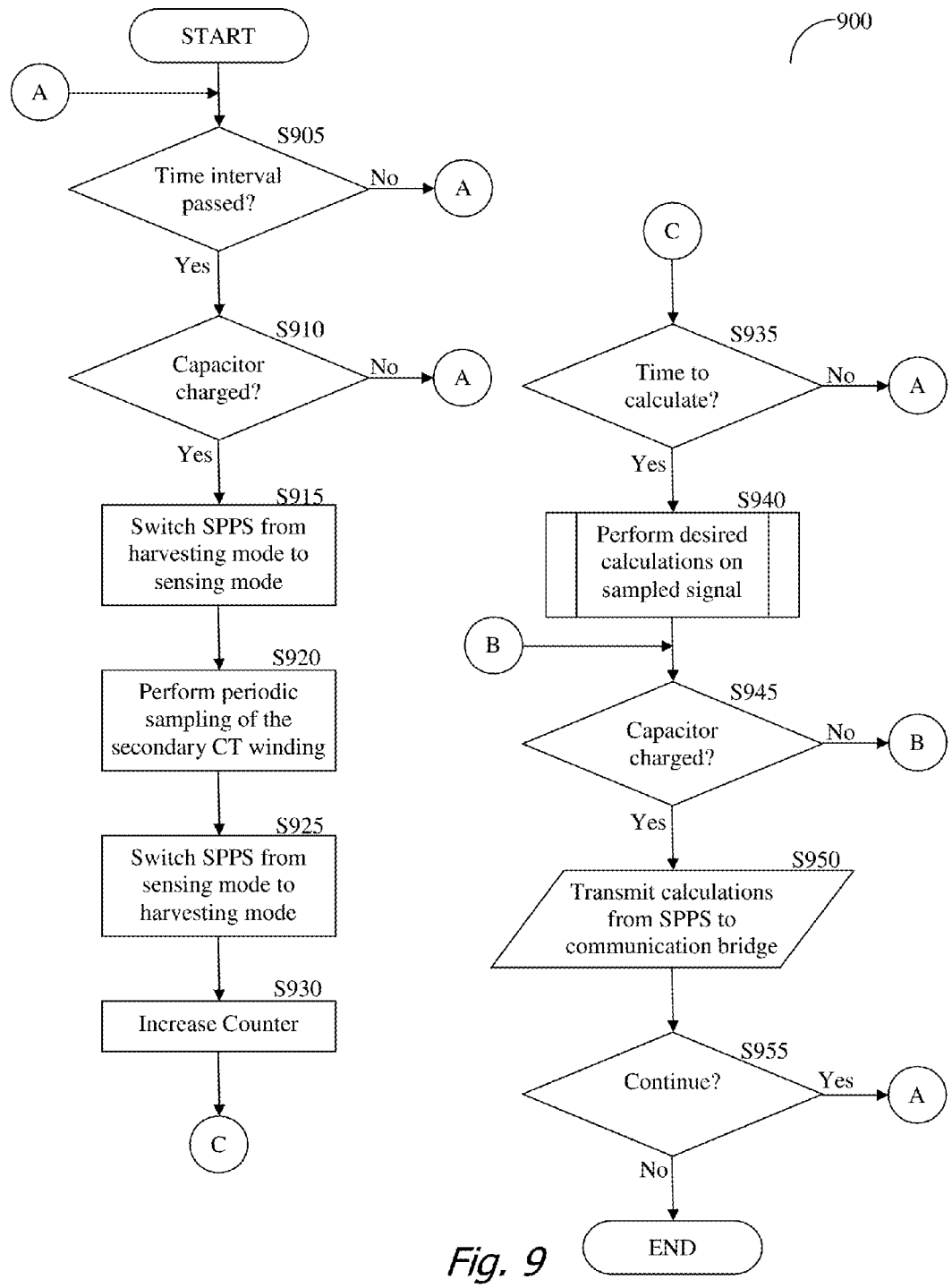
FIG. 9 is a flowchart describing the operation of a self-powered sensor in accordance with an embodiment of the invention.

FIG. 9 depicts an exemplary and non-limiting flowchart 900 that describes the operation of a SPPS 510 in accordance with an embodiment of the invention. In S905 it is checked whether the required time interval has passed and if not the loop contains until such time that the period has passed and execution can continue with S910. In S910 it is checked if the charge capacitor of the energy harvester 616, shown in FIG. 6 has a sufficient energy stored therein and if so execution continues with S915; otherwise, execution continues with S905. In S915 the SPPS 510 switches from harvest mode to sense mode using switch 614 and then there is a wait for a predefined relaxation period to discharge the resonance capacitor. In another embodiment, it is possible to detect zero crossing of the signal and not require the relaxation period without departing from the scope of the invention. In S620 a sampling of the signal received from the secondary winding of the CT 612 is repeated 'n' times at a rate of 'y' samples per second so that an integer number of periods or half periods is sampled exactly. In S925 the SPPS 510 switches back to harvesting mode, i.e., the switch 614 disconnects the connection to the sense resistor 618 and connects to the energy harvester 616. In S930 a counter (which, while not shown for simplicity was initialized, for example, to a value of '0') is incremented. In S935 it is checked if it is time to perform the calculation by checking whether the time from the beginning of the process is larger than a predetermined time T or if the counter value is larger than a predetermined value 'N' and if so execution continues with S940; otherwise, execution continues with S905. This allows to maintaining a constant time interval between transmissions as well as limiting the number of samples to avoid memory overflow in the SPPS. In S940 calculations are performed with respect of the plurality of samples gathered by the SPPS 510, and as further detailed herein in exemplary cases, and may include calculations such as true RMS, average RMS values, calibration of the results, and the likes. It should be noted that while calculations are shown to be performed in S940 it is possible to perform at least some calculations each subsequent to S925 on a per-sample level without departing from the scope of the invention. This may include, for example, preforming the RMS calculation of each sampled vector. In S945 it is checked whether the reservoir capacitor of the energy harvester 616 has sufficient energy stored therein for transmission and if so execution continues with S950; otherwise, execution continues to wait at S945 until such time that the capacitor is sufficiently charged to allow for proper transmission. In S950 a transmission of the calculated results takes place at the RF transceiver 650. Optionally, a carrier sense mechanism, e.g., 'listen before talk', is used to check if the air is free for transmission; otherwise, waiting for another period in harvesting mode and repeating the check. In S955 it is checked whether it is necessary to continue and if so execution continues with S905; otherwise, execution terminates. It should be noted that in some embodiment S955 is not actually implemented and execution continues with S905 immediately subsequent to S950, and without departure from the scope of the invention. It is noted that although not shown in flowchart 900 it is possible that various other types of transmissions and processes take place in SPPS 510. These may happen throughout the process at different time intervals and may include, but are not limited to, management and state parameters, other types of measurements the SPPS 510 may be able to perform, for example time measurement, current on/off condition, current change indications, temperature indications, device management data, current data in different forms etc., some of which are further described herein below in greater detail.

According to the principles of the invention a SPPS 510 transmits a time synchronization signal based on the time of its internal clock every time interval. This time interval should be chosen to take into account the internal drift in the SPPS 510 clock, so that it is smaller than the allowed error in the current to voltage phase measurement required. For example, if the drift is 100 µSec/minute, and the required phase error is ~0.5%, which is ~100 µSec in a 20 mSec period of 50 Hz, the synchronization message should be sent at least once every minute. The communication bridge 520 includes a real time clock (RTC) mechanism either through an internal hardware component or using the network time protocol (NTP) which provides a real time clock through the internet, or any combination thereof. The communication bridge 520 receives the SPPS 510 synchronization message thereafter holds and stores a synchronization factor between the specific SPPS 510, for example SPPS 510-1, internal clock and the real time clock in its internal memory. The communication bridge 520 may further make use of a database, for example but without limitations database 540, for storing of the individual synchronization factors of each SPPS 510 it communicates with.

Figure 10:
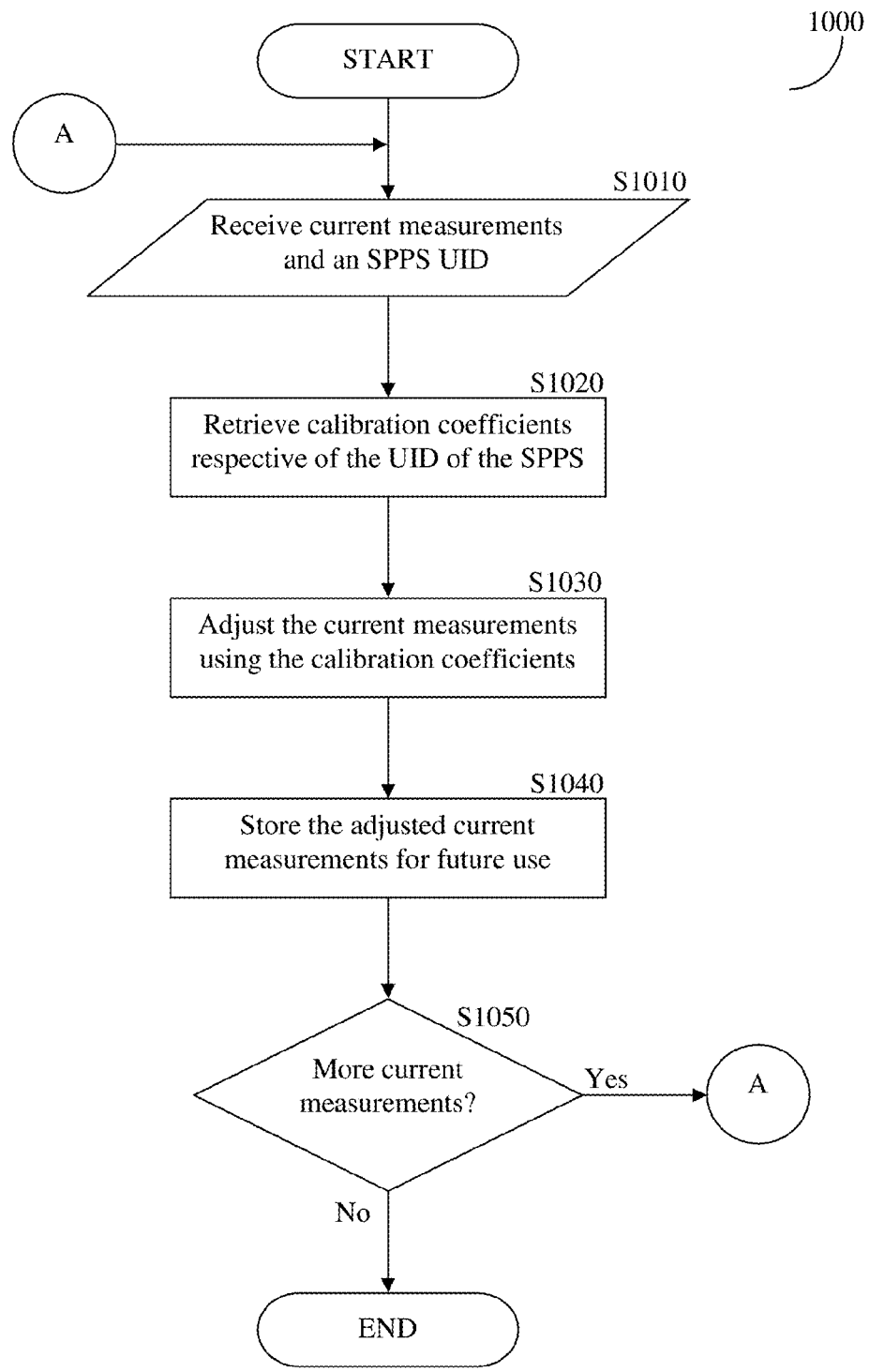
FIG. 10 is a flowchart describing the calibration operation of a self-powered sensor in accordance with an embodiment of the invention.

Periodically, at predefined intervals, the SPPS 510 samples one or more periods of the secondary signal and transmits the entire sampled vector, rather than the RMS value as in normal transmissions, to the communication bridge 520. For the purpose of synchronization a timestamp of the SPPS 510 is also sent with the vector indicating the exact time of sampling of at least one of the samples of the vector. In another embodiment, instead of transmitting the entire sampled vector, the SPPS measures one or more significant points of the signal, and sends the timestamp of that point. Timestamps may be, without limitations, the time of the peak of the signal, timestamp of zero crossing, timestamp of a sample in the vector of plurality of samples, as well as other timestamps. FIG. 10 depicts an exemplary and non-limiting timing diagram 1000 of the communication that occurs between the SPPS 510 and the communication bridge 520. A series of RMS current measurements 1010 are sent followed by timing synchronization information 1020, a sequence which may repeat one or more times. Periodically a sampled vector 1030 is sent as explained hereinabove. Other messages 1040 having content not specifically shown herein may also be optionally included in the sequence of messages communicated from the SPPS 510 to the communication bridge 520.

In one embodiment of the invention, and as further noted hereinabove, the SPPS 510 may have a receive mode in which it can accept information from the communication bridge 520. In such a case it is possible to have the SPPS 510 receive and maintain for a period of time a correct real-time clock. The phase of the voltage may also be transmitted to the SPPS 510, for example from the communication bridge 520, thereby enabling the SPPS 510 to perform calculations of the phase shift between the current and the voltage rather than having it calculated centrally.

One of ordinary skill in the art would readily appreciate that each SPPS 510-1 through 510-N, where N is an integer equal to or greater of one, shown in FIG. 5, may have slightly different measurement results when operating as part of the system. Such differences require calibration of each SPPS 510 after completion of manufacturing. Calibration of each SPPS 510 may prove to be expensive, even if performed during the manufacturing process, and may still be insufficient as other coefficients, such as environmental coefficients respective of temperature and humidity that are unique to the location at which a specific SPPS 510 is placed at. A different approach for calibration is suggested where use of a UID unique to each SPPS 510 is employed. Specifically, the calibration coefficients of each SPPS 510 is determined at the time of manufacturing and then stored in a database, for example, database 540. When current samples are received from an SPPS, for example, SPPS 510-1, accompanied by the SPPS 510-1 UID, the database 540 is checked for the calibration coefficients of SPPS 510-1 and the current measurements adjusted accordingly. In an embodiment of the invention sensors are further placed in the vicinity of SPPS 510-1, or a group of SPPSs 510, which are further used to calibrate the SPPS 510-1 for an accurate current reading. The database 540 may further contain, respective of each SPPS 510 a manufacturing date which may further impact the adjustments required to the measure currents that are respective to the aging of the SPPS 510. This may be further tied to the actual amount of current passing through the SPPS 510, further leading to more accurate adjustments of current readings over time. While in the description hereinabove it is described that all calibration coefficients are stored in database 540, other embodiments are possible without departing from the scope of the invention. For example, and without limitation, one or more of the calibration coefficients may be stored in memory 630 of an SPPS 510, and sent together with current measurements and the UID of the SPPS 510 for the purpose of calibration of the current measurements. A variety of calibration coefficients may be used without departing from the scope of the invention. One or more coefficients may be provided on a per SPPS 510, in one embodiment, while in another embodiment one or more coefficients may be provided for a plurality of SPPS 510, for example, and without limitation, SPPS 510-1, 510-2, 510-3 . . . to 510-10.

FIG. 10 depicts an exemplary and non-limiting flowchart 1000 of the calibration operation of a self-powered sensor in accordance with an embodiment of the invention. In S1010 current measurements accompanied by a UID of an SPPS 510, for example SPPS 510-1, are received. In S1020 one or more calibration coefficients are retrieved from a database, for example database 540, respective of the SPPS 510-1 from which the current measurements are received. As noted above, in one embodiment at least one calibration coefficient is received from SPPS 510-1. In S1030 calibration of the current measurements is performed based on the received current measurements and the available calibration coefficients. In one embodiment additional coefficients, such as environmental coefficients of temperature and/or humidity, provided with respect of the location of the SPPS 510-1, are also used for adjustment of the current measurements. In yet another embodiment, manufacturing information, such as a manufacturing date, is retrieved to further be used in the calibration of the current measurements. And in a further embodiment, historical data respective of the current flow through the SPPS 510-1 is retrieved from a database, for example database 540, for further calibration of the current measurements. In S1040 the adjusted current measurements of SPPS 510-1 are stored in memory, for example in database 540, for further use. In S1050 it is checked whether additional current measurements are to be received and if so execution continues with S1010; otherwise, execution terminates.

Coefficient adjustment may take various forms of which a few examples are provided herein but without limiting the scope of the invention. In the case of a Linear Fit coefficients 'a' and 'b' of a particular SPPS are made available and a current measurement of 'X' is received. The calibrated current measurement will therefore be aX+b. Higher order equations may be also used, for example and without limitation, the $2^{nd}$ order equation $aX^2+bX+c$, where 'c' is yet another coefficient respective of a particular SPPS 510. Other linear and nonlinear approaches may be used without departing from the scope of the invention. In yet another embodiment the correction may be different for different ranges of measured current, i.e., piecewise linear, or piecewise non-linear. For example, a current in a first range of currents may have a first correction equation while a current measure in a second range may have a second correction equation that is different from the first correction equation. For example, without limitation, for currents measured by an SPPS 510 in the range of 0-20 A there may be two adjustment curves. A first adjustment curve having the coefficients $a_1$ and $b_1$ and a second curve defined by the coefficients $a_2$ and $b_2$. For the range 0-10 A the calibrated current measurement is calculated as $a_1x+b_1$, and for currents above 10 A the calibrated current measurement is $a_2X+b_2$. This particular embodiment is particularly useful with respect of CTs, for example CT 612, where the response curve (magnetization curve) has an S shape and can be divided into three main linear sections: flat slope at low or very high currents, and steep at medium currents. Another advantage of this method is expansion of the dynamic range of the sensor by enabling accurate measurements in areas in which the response curve is nonlinear. One of ordinary skill in the art will readily appreciate that current as well as power can be measured using the principles described herein.

It should be recognized that a CT-based sensor, may also cause a phase shift that may impact the accuracy of the measurements. Therefore, in one embodiment of the invention, where the SPPS is used to measure other parameters such as power factor, a phase calibration factor may also exist.

Of course, it should be understood that a single calibration factor for all of the SPPS 510 is also possible without departing from the scope of the invention. While the description above was made with respect of a SPPS 510 which is a wireless device, wired devices, such as but not limited to the network connected meter 590 may be equally used without departing from the scope of the invention. Moreover, in certain embodiments of the invention coefficients may be stored solely in the database 540, solely in a SPPS 510, solely in the server 580, solely in the communication bridge 520 or any combination thereof. Similarly, calculation of the corrected current, phase, or any other measurement made by SPPS 510, or other similar device such as, but not limited to, a wired measurement device, may be performed solely in the SPPS 510, solely in the server 580, solely in the communication bridge 520 or any combination thereof. It should be further understood that database 540 may be continuously updated with coefficient information respective of each SPPS 510 from a variety of sources, whether newly manufactured or otherwise recalibrated. It should be further understood that database 540 may be a distributed database.

The principles of the invention, wherever applicable, are implemented as hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program embodied in non-transitory computer readable medium, or any combination thereof, which may be executed by a CPU, whether or not such computer or processor is explicitly shown. In addition, various other peripheral units may be connected to the computer platform such as an additional data storage unit and a printing unit. The circuits described hereinabove may be implemented in a variety of manufacturing technologies well known in the industry including but not limited to integrated circuits (ICs) and discrete components that are mounted using surface mount technologies (SMT), and other technologies. The scope of the invention should not be viewed as limited by the types of packaging and physical implementation of the SPPS 510 or the communication bridge 520. Furthermore, error correction according to this invention includes, but is not limited to, measurement corrections respective of at least one of the transformer core being a split core, variation in materials, variation in windings, variation in temperature, variation in reference voltage, effects of aging of the apparatus, combinations thereof, and more.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An apparatus comprising:
    at least one analog section comprising a current transformer having a transformer core configured to mount around an alternating current (AC) power line alternating at a fixed frequency making the AC power line a primary winding of the current transformer and further comprising a resonance capacitor connected in parallel to a secondary winding of the current transformer to resonate with the secondary winding inductance at the primary fixed frequency, the resonance capacitor's value being selected so that maximum resonance is achieved at low currents of the primary winding and at a low non-linear range of a magnetization curve of the transformer core, the analog section for harvesting energy from the secondary winding on the transformer core, and storing it for use by components of the apparatus and periodically switching to allow sampling of a current flowing through the current transformer by a sense resistor;

a memory containing therein at least a calibration coefficient for correction of a vector generated respective of the sampling of a current flowing through the current transformer, the vector including a plurality of cycles over a plurality of periods of the fixed frequency;

a microcontroller connected to the at least one analog section to receive harvested energy and to the memory, to determine: the vector, at least a value respective of the vector the value corrected as the at least a calibration coefficient, a time stamp;

a transmitter connected to the microcontroller enabled to periodically transmit, under the control of the microcontroller the at least a value, the time stamp, and the at least a calibration coefficient;

such that a receiver of the at least a value may use the at least a value for determination of at least an electrical parameter.

2. The apparatus of claim 1, wherein the at least a calibration coefficient is used for the correction of errors resulting from at least: the transformer core being a split core, variation in materials, variation in windings, variation in air-gap, variation in temperature, variation in reference voltage, or effects of aging of the apparatus.

3. The apparatus of claim 1, further comprising at least one of:
a diode bridge coupled in parallel to the secondary winding of the current transformer; or
a voltage multiplier coupled in parallel to the secondary winding of the current transformer.

4. The apparatus of claim 1, wherein the at least a value is at least one of: RMS value, peak value, average value, RMS squared value, a representative average value, or a vector of a plurality of samples of the at least an analog signal.

5. The apparatus of claim 1, wherein storage of the at least a calibration coefficient occurs in one of: at manufacturing of the apparatus, or provided by a receiver of the apparatus and stored in the memory.

6. The apparatus of claim 1, wherein the at least a calibration coefficient comprises a first calibration coefficient for a first range of a parameter respective of the apparatus and a second calibration coefficient for a second range of the parameter respective of the apparatus.

7. The apparatus of claim 1, wherein the at least an electrical parameter comprises at least one of: current, phase shift between voltage and current, real power, apparent power, reactive power, power factor, distortion factor, or total harmonic distortion (THD) of the at least an analog signal.

8. The apparatus of claim 1, wherein the switching comprises use of a first switch operative in a positive phase of an AC cycle on the AC power line and a second switch operative in the negative phase of the AC cycle on the AC power line.

9. The apparatus of claim 1, wherein the sense resistor is connected to a secondary winding of the current transformer.

10. The apparatus of claim 1, wherein the microcontroller operates in a continuous mode when sufficient energy is available from the analog section, and in the continuous mode, performs continuous measurements of the analog signal, stores information responsive to the continuous measurements and causes the transmission of the information using the transmitter.

11. The apparatus of claim 10, wherein the continuous measurements include at least one of: peak detection, phase detection, or power disruption.

12. The apparatus of claim 1, further comprising:
a wireless receiver connected to the microcontroller for wireless receipt of at least a new correction coefficient.

13. The apparatus of claim 1, wherein the receiver is one of: a communication bridge, a local server, or a network server.

14. A system comprising:
an interface to a network;
a processor communicatively coupled through the interface to the network;
a database communicatively coupled to the processor, the data base containing at least a calibration coefficient of a plurality of self-powered power sensors (SPPSs), each SPPS comprising at least one analog section comprising a current transformer having a transformer core configured to mount around an alternating current (AC) power line alternating at a fixed frequency making the AC power line a primary winding of the current transformer and further comprising a resonance capacitor connected in parallel to a secondary winding of the current transformer to resonate with the secondary winding inductance at the primary fixed frequency, the resonance capacitor's value being selected so that maximum resonance is achieved at low currents of the primary winding and at a low non-linear range of a magnetization curve of the transformer core, the analog section for harvesting energy from the secondary winding on the transformer core, and storing it for use by components of the apparatus and periodically switching to allow sampling of a current flowing through the current transformer by a sense resistor; and
a memory communicatively coupled to the processor containing therein instructions that when executed by the processor configure the system to: receive from at least an SPPS communicatively coupled to the system at least a vector generated respective of the sampling of a current flowing through the current transformer, the vector including a plurality of cycles over a plurality of periods of the fixed frequency and a unique identification (UID) of the SPPS; extract from the database the at least a calibration coefficient respective of the SPPS and the at least a vector; and, adjust the received at least a vector according with the at least a calibration coefficient.

15. The system of claim 14, wherein each of the at least an SPPS has at least a unique corresponding calibration parameter.

16. The system of claim 14, wherein a plurality of the at least an SPPS has at least a unique corresponding calibration parameter.

17. The system of claim 14, wherein the memory further contains instructions that when executed by the processor configure the system to store the adjusted vector for future use.

18. The system of claim 14, wherein the memory further contains instructions that when executed by the processor configure the system to receive a calibration coefficient from the SPPS.

19. The system of claim 14, wherein the memory further contains instructions that when executed by the processor configure the system to receive a calibration coefficient from the database.

20. The system of claim 14, wherein adjusting the received vector further comprises an adjustment based on a coefficient respective of environmental parameters.

21. The system of claim 14, wherein adjusting the received vector further comprises at least one of: a linear adjustment, a nonlinear adjustment, a piecewise linear adjustment, a piecewise nonlinear adjustment, or combinations thereof.

22. The system of claim 14, wherein the network is one of: a local area network (LAN), a wide area network (WAN), a metro area network (MAN), the Internet, the world wide web (WWW), WLAN (Wireless LAN), or any combination thereof.

23. A method comprising:
receiving at least a unique identification (UID) from a self-powered power sensor (SPPS), the SPPS comprising at least a resonance capacitor connected in parallel to a secondary winding of a current transformer of the SPPS, the resonance capacitor to resonate with the secondary winding inductance at a primary fixed frequency of the primary winding fed from a powerline, the resonance capacitor's value being selected so that maximum resonance is achieved at low currents of the primary winding and at a low non-linear range of a magnetization curve of the transformer core;
receiving a vector generated respective of the sampling of a current flowing through the primary winding of the current transformer, the vector including a plurality of cycles over a plurality of periods of the fixed frequency;
retrieving at least a calibration coefficient respective of the SPPS; and
adjusting the vector using the at least a calibration coefficient.

24. The method of claim 23, further comprising:
storing the adjusted vector in a memory.

25. The method of claim 23, further comprising:
receiving a calibration coefficient from the SPPS.

26. The method of claim 23, further comprising:
receiving by a wireless receiver of the SPPS a calibration coefficient from a database containing at least a coefficient respective of the SPPS.

27. The method of claim 23, wherein adjusting the vector comprises an adjustment based on coefficient respective of environmental parameters.

28. The method of claim 23, wherein adjusting the at least a vector comprises at least one of: linear adjustment, nonlinear adjustment, piecewise linear adjustment, piecewise nonlinear adjustment, combinations thereof.

29. A non-transitory computer readable medium having stored thereon instructions for causing a processor to perform a method of claim 23.

* * * * *